United States Patent
Inamasu et al.

(10) Patent No.: US 12,538,825 B2
(45) Date of Patent: Jan. 27, 2026

(54) BONDING APPARATUS, BONDING SYSTEM, AND BONDING METHOD

(71) Applicant: Tokyo Electron Limited, Tokyo (JP)

(72) Inventors: Toshifumi Inamasu, Koshi (JP); Tetsuya Maki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 440 days.

(21) Appl. No.: 18/005,392

(22) PCT Filed: Jul. 5, 2021

(86) PCT No.: PCT/JP2021/025248
§ 371 (c)(1),
(2) Date: Jan. 13, 2023

(87) PCT Pub. No.: WO2022/014384
PCT Pub. Date: Jan. 20, 2022

(65) Prior Publication Data
US 2023/0275062 A1   Aug. 31, 2023

(30) Foreign Application Priority Data

Jul. 17, 2020 (JP) .................................. 2020-122588

(51) Int. Cl.
*H01L 23/00* (2006.01)

(52) U.S. Cl.
CPC .............. *H01L 24/74* (2013.01); *H01L 24/80* (2013.01); *H01L 2224/74* (2013.01);
(Continued)

(58) Field of Classification Search
CPC ..... H01L 24/74; H01L 24/80; H01L 2224/74; H01L 2224/80012; H01L 2224/8016;
(Continued)

(56) References Cited

U.S. PATENT DOCUMENTS

| | | | | |
|---|---|---|---|---|
| 5,907,390 A | * | 5/1999 | Sakamoto | G03F 9/70 356/400 |
| 2008/0239257 A1 | * | 10/2008 | Hagiwara | G03F 7/70858 355/30 |
| 2019/0273063 A1 | | 9/2019 | Nakamitsu et al. | |

FOREIGN PATENT DOCUMENTS

| JP | H08-285520 | * | 11/1996 |
|---|---|---|---|
| JP | H08-285520 A | | 11/1996 |

(Continued)

OTHER PUBLICATIONS

International Search Report for PCT/JP2021/025248 dated Sep. 7, 2021.

*Primary Examiner* — Christopher W Raimund
(74) *Attorney, Agent, or Firm* — Chrisman Gallo Tochtrop LLC

(57) ABSTRACT

A bonding apparatus includes a first holder, a second holder, a moving unit, a housing, an interferometer, a first gas supply and a second gas supply. The first holder is configured to attract and hold a first substrate. The second holder is configured to attract and hold a second substrate. The moving unit is configured to move a first one of the first holder and the second holder in a horizontal direction with respect to a second one thereof. The interferometer is configured to radiate light to the first one or an object moved along with the first one to measure a horizontal distance thereto. The first gas supply is configured to supply a clean first gas to an inside of the housing. The second gas supply is configured to supply a second gas to a space between the interferometer and the first one or the object.

12 Claims, 8 Drawing Sheets

(52) U.S. Cl.
CPC ............... *H01L 2224/80012* (2013.01); *H01L 2224/8016* (2013.01); *H01L 2224/8018* (2013.01); *H01L 2224/80896* (2013.01); *H01L 2224/80908* (2013.01); *H01L 2224/80986* (2013.01); *H01L 2924/401* (2013.01)

(58) Field of Classification Search
CPC ... H01L 2224/8018; H01L 2224/80896; H01L 2224/80908; H01L 2224/80986; H01L 2924/401; H01L 21/02
See application file for complete search history.

(56) References Cited

FOREIGN PATENT DOCUMENTS

| | | | |
|---|---|---|---|
| JP | 2011-049318 A | 3/2011 |
| JP | 2015-018926 A | 1/2015 |
| KR | 10-2015-0074084 A | 7/2015 |
| WO | 2014/064944 A1 | 5/2014 |
| WO | 2018/088094 A1 | 5/2018 |

* cited by examiner

BONDING APPARATUS, BONDING SYSTEM, AND BONDING METHOD

CROSS-REFERENCE TO RELATED APPLICATIONS

This Application is a U.S. national phase application under 35 U.S.C. § 371 of PCT Application No. PCT/JP2021/025248 filed on Jul. 5, 2021, which claims the benefit of Japanese Patent Application No. 2020-122588 filed on Jul. 17, 2020, the entire disclosures of which are incorporated herein by reference.

TECHNICAL FIELD

The various aspects and embodiments described herein pertain generally to a bonding apparatus, a bonding system, and a bonding method.

BACKGROUND

Conventionally, in order to meet the demand for high integration of semiconductor devices, it has been proposed to use a three-dimensional integration technique of stacking the semiconductor devices in three dimensions. As an example of a system using this three-dimensional integration technique, there is known a bonding technique of bonding substrates such as semiconductor wafers to each other.

Patent Document 1: International Publication No. 2018/088094

SUMMARY

In an exemplary embodiment, a bonding apparatus configured to bond substrates to each other includes a first holder, a second holder, a moving unit, a housing, an interferometer, a first gas supply and a second gas supply. The first holder is configured to attract and hold a first substrate from above. The second holder is configured to attract and hold a second substrate from below. The moving unit is configured to move a first one of the first holder and the second holder in a horizontal direction with respect to a second one of the first holder and the second holder. The housing accommodates therein the first holder, the second holder, and the moving unit. The interferometer is disposed within the housing and is configured to radiate light to the first one or an object moved along with the first one to measure a horizontal distance to the first one or the object. The first gas supply is configured to supply a clean first gas to an inside of the housing. The second gas supply is configured to supply a second gas to a space between the interferometer and the first one or the object to which the light is radiated.

DETAILED DESCRIPTION

Figure 1:
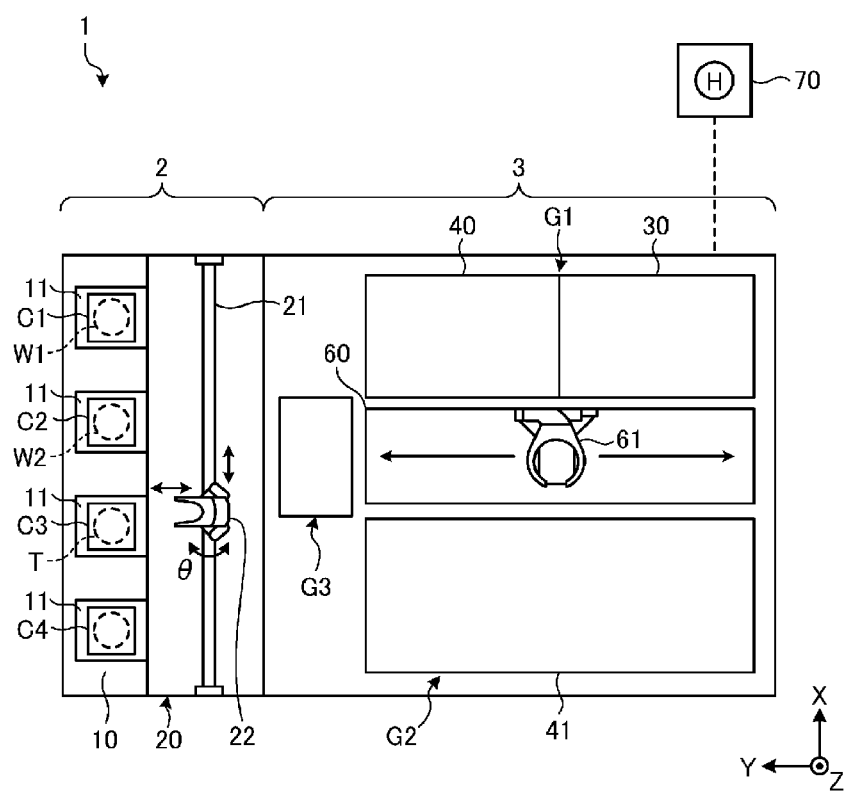
FIG. 1 is a schematic diagram illustrating a configuration of a bonding system according to an exemplary embodiment.

Hereinafter, embodiments for a bonding apparatus, a bonding system, and a bonding method according to the present disclosure (hereinafter, referred to as "exemplary embodiments") will be described in detail with reference to the accompanying drawings. Further, it should be noted that the bonding apparatus, the bonding system and the bonding method according to the present disclosure are not limited by the exemplary embodiments. Further, unless processing contents are contradictory, the various exemplary embodiments can be appropriately combined. Furthermore, in the various exemplary embodiments to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as "θ direction."

In recent years, semiconductor devices are getting highly integrated. If a multiple number of highly integrated semiconductor devices are placed on a horizontal plane and theses semiconductor devices are connected by wiring to be produced as a product, there is a concern that the length of the wiring may be increased, resulting in an increase of resistance of the wiring and an increase of a wiring delay.

In view of this, it has been proposed to use a three-dimensional integration technique of stacking semiconductor devices three-dimensionally. In this three-dimensional integration technique, two sheets of semiconductor wafers (hereinafter, referred to as "substrates") are bonded by using a bonding system described in Patent Document 1, for example.

In a bonding apparatus of this bonding system, one substrate (hereinafter, referred to "first substrate") and the other substrate (hereinafter, referred to as "second substrate") are bonded together in the state that the first substrate is held by using a first holder and the second substrate is held by using a second holder that is disposed below the first holder. Before the substrates are bonded to each other in this way, the second holder is moved in a horizontal direction to adjust the positions of the first substrate and the second substrate in the horizontal direction, and the second holder is moved in a vertical direction to adjust the positions of the first substrate and the second substrate in the vertical direction.

In the bonding apparatus described in Patent Document 1, when the second holder is moved in the horizontal direction, a distance of a moving unit in the horizontal direction is measured by using a laser interferometer. By controlling the moving unit based on the measurement result, the position of the second holder in the horizontal direction is adjusted.

In the technique of bonding the substrates to each other as described above, there is a demand for improving bonding precision between the substrates. By way of example, the bonding precision can be improved by minimizing a positional deviation between the first substrate and the second substrate in the horizontal direction.

<Configuration of Bonding System>

Figure 2:
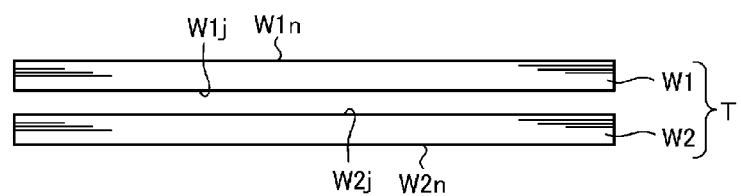
FIG. 2 is a schematic diagram illustrating a state of a first substrate and a second substrate before they are bonded according to the exemplary embodiment.

First, a configuration of a boding system according to an exemplary embodiment will be described with reference to FIG. 1 and FIG. 2. FIG. 1 is a schematic diagram illustrating the configuration of the bonding system according to the exemplary embodiment. FIG. 2 is a schematic diagram illustrating a state of a first substrate and a second substrate before they are bonded according to the exemplary embodiment.

A bonding system 1 shown in FIG. 1 is configured to form a combined substrate T by bonding a first substrate W1 and a second substrate W2 (see FIG. 2).

The first substrate W1 and the second substrate W2 are single crystalline silicon wafers, and a multiple number of electronic circuits are formed on their plate surfaces. The first substrate W1 and the second substrate W2 have the substantially same diameter. Alternatively, either one of the first substrate W1 and the second substrate W2 may be a substrate on which no electronic circuit is formed.

In the following description, as shown in FIG. 2, among plate surfaces of the first substrate W1, a plate surface to be bonded to the second substrate W2 will be referred to as "bonding surface W1$j$", and a plate surface opposite to the bonding surface W1$j$ will be referred to as "non-bonding surface W1$n$". Further, among plate surfaces of the second substrate W2, a plate surface to be bonded to the first substrate W1 will be referred to as "bonding surface W2$j$", and a plate surface opposite to the bonding surface W2$j$ will be referred to as "non-bonding surface W2$n$".

As depicted in FIG. 1, the bonding system 1 includes a carry-in/out station 2 and a processing station 3. The carry-in/out station 2 is disposed on the positive Y-axis side of the processing station 3, and is connected as a single body with the processing station 3.

The carry-in/out station 2 includes a placing table 10 and a transfer section 20. The placing table 10 is equipped with a multiple number of placing plates 11. Respectively provided on the placing plates 11 are cassettes C1 to C4 each of which accommodates therein a plurality of (e.g., 25 sheets of) substrates horizontally. The cassette C1 accommodates therein a plurality of first substrates W1; the cassette C2, a plurality of second substrates W2; and the cassette C3, a plurality of combined substrates T. The cassette C4 is a cassette for collecting, for example, a defective substrate. Further, the number of the cassettes C1 to C4 placed on the placing plates 11 is not limited to the shown example.

The transfer section 20 is provided adjacent to the negative Y-axis side of the placing table 10. Provided in the transfer section 20 are a transfer path 21 extending in the X-axis direction and a transfer device 22 configured to be movable along the transfer path 21. The transfer device 22 is configured to be movable in the Y-axis direction as well as in the X-axis direction and pivotable around the Z-axis. The transfer device 22 transfers the first substrates W1, the second substrates W2, and the combined substrates T between the cassettes C1 to C4 placed on the placing plates 11 and a third processing block G3 of the processing station 3 to be described later.

The processing station 3 is provided with, for example, three processing blocks G1, G2 and G3. The first processing block G1 is disposed on the rear side (positive X-axis side of FIG. 1) of the processing station 3. Further, the second processing block G2 is provided on the front side (negative X-axis side of FIG. 1) of the processing station 3, and the third processing block G3 is disposed on the carry-in/out station 2 side (positive Y-axis side of FIG. 1) of the processing station 3.

Disposed in the first processing block G1 is a surface modifying apparatus 30 configured to modify the bonding surface W1$j$ of the first substrate W1 and the bonding surface W2$j$ of the second substrate W2. The surface modifying apparatus 30 cuts a $SiO_2$ bond on the bonding surfaces W1$j$ and W2$j$ of the first and second substrates W1 and W2 into a single bond of SiO, thus allowing the bonding surfaces W1$j$ and W2$j$ to be modified so that they are easily hydrophilized afterwards.

Specifically, in the surface modifying apparatus 30, an oxygen gas or a nitrogen gas as a processing gas is excited into plasma under, for example, a decompressed atmosphere to be ionized. As these oxygen ions or nitrogen ions are radiated to the bonding surfaces W1$j$ and W2$j$ of the first and second substrates W1 and W2, the bonding surfaces W1$j$ and W2$j$ are modified by being plasma-processed.

Further, in the first processing block G1, a surface hydrophilizing apparatus 40 is disposed. The surface hydrophilizing apparatus 40 is configured to hydrophilize and clean the bonding surfaces W1$j$ and W2$j$ of the first and second substrates W1 and W2 with, for example, pure water. To elaborate, the surface hydrophilizing apparatus 40 supplies the pure water onto the first substrate W1 or the second substrate W2 while rotating the first substrate W1 or the second substrate W2 held by, for example, a spin chuck. Accordingly, the pure water supplied onto the first substrate W1 or the second substrate W2 is diffused on the bonding surface W1$j$ of the first substrate W1 or the bonding surface W2$j$ of the second substrate W2, so that the bonding surfaces W1$j$ and W2$j$ are hydrophilized.

Here, although the surface modifying apparatus 30 and the surface hydrophilizing apparatus 40 are arranged side by side, the surface hydrophilizing apparatus 40 may be stacked on top of or under the surface modifying apparatus 30.

In the second processing block G2, a bonding apparatus 41 is disposed. The boning apparatus 41 is configured to bond the hydrophilized first and second substrates W1 and W2 by an intermolecular force. A specific configuration of the bonding apparatus 41 will be described later.

A transfer section 60 is formed in a region surrounded by the first processing block G1, the second processing block G2, and the third processing block G3. A transfer device 61 is disposed in the transfer section 60. The transfer device 61 has a transfer arm configured to be movable in a vertical direction and a horizontal direction and pivotable around a vertical axis, for example. This transfer device 61 is moved within the transfer section 60 and transfers the first substrate W1, the second substrate W2 and the combined substrate T to preset devices within the first processing block G1, the second processing block G2, and the third processing block G3 which are adjacent to the transfer section 60.

Furthermore, the bonding system 1 is equipped with a control device 70. The control device 70 controls an operation of the bonding system 1. This control device 70 may be implemented by, for example, a computer, and includes a controller and a storage that are not illustrated here. The controller includes a microcomputer having a CPU (Central Processing Unit), a ROM (Read Only Memory), a RAM (Random Access Memory), an input/output port, and so forth as well as various kinds of circuits. The CPU of the microcomputer implements a control to be described later by reading out and executing a program stored in the ROM. Further, the storage may be implemented by, for example, a semiconductor memory device such as a RAM or a flash memory, or a storage device such as a hard disk or an optical disk.

Further, the program may be recorded on a computer-readable recording medium and installed from the recording medium to the storage of the control device 70. The computer-readable recording medium may be, by way of non-limiting example, a hard disk HD, a flexible disk FD, a compact disk CD, a magnetic optical disk MO, a memory card, or the like.

<Configuration of Bonding Apparatus>

Figure 3:
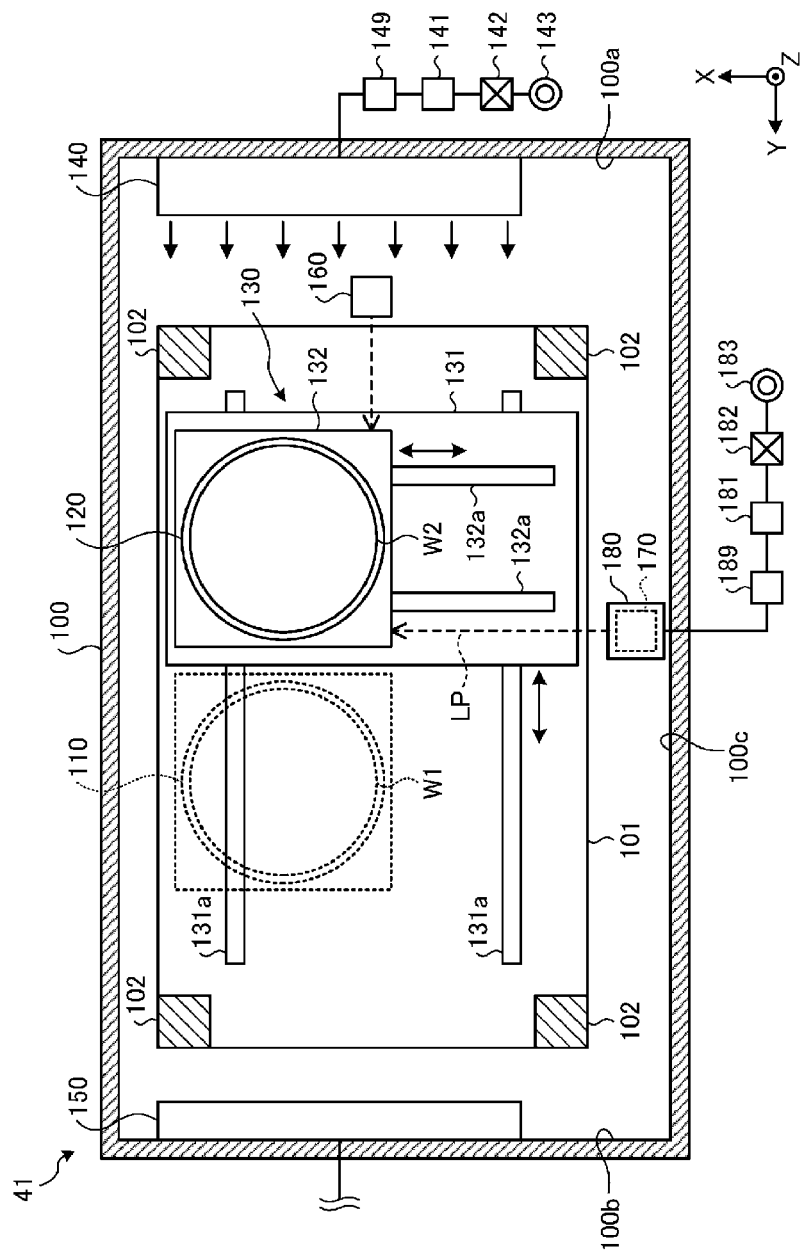
FIG. 3 is a plan view of a bonding apparatus according to the exemplary embodiment.
Figure 4:
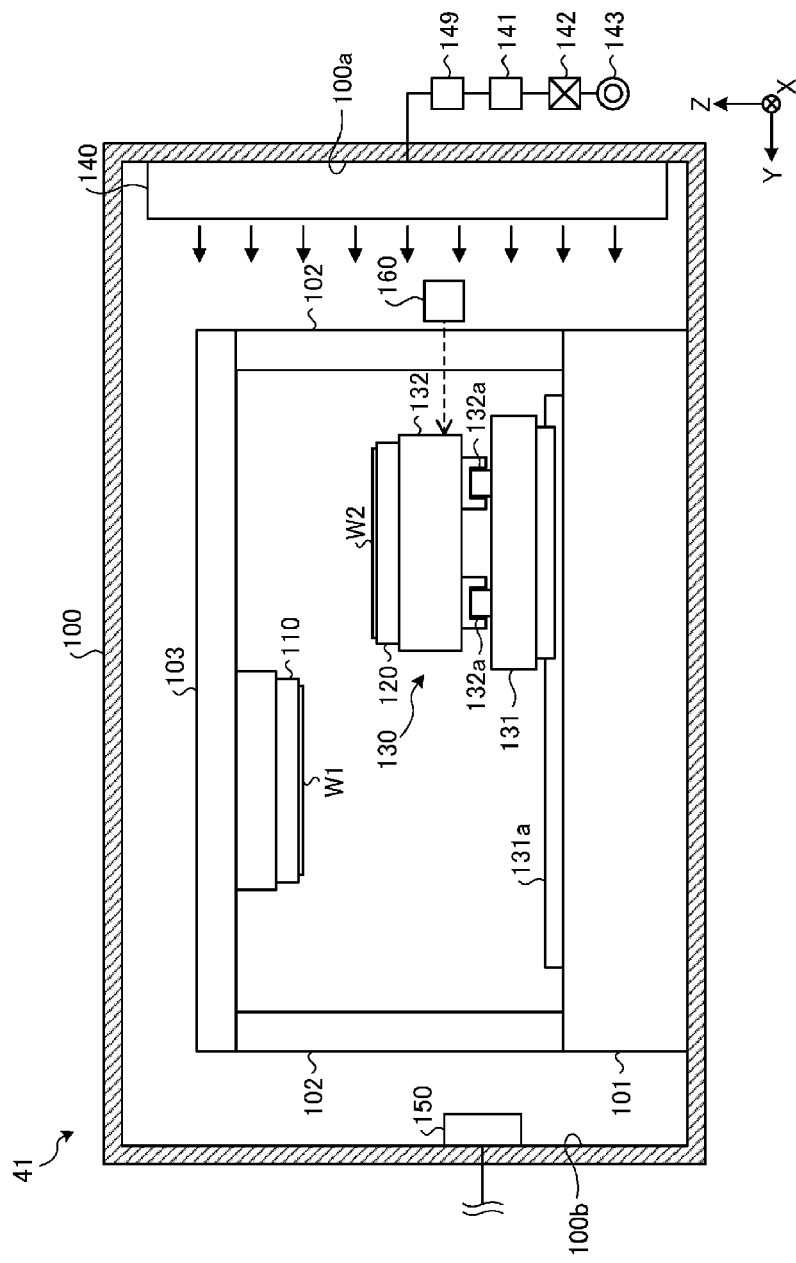
FIG. 4 is a side view of the bonding apparatus according to the exemplary embodiment.

Here, the configuration of the bonding apparatus 41 will be explained with reference to FIG. 3 and FIG. 4. FIG. 3 is a plan view of the bonding apparatus 41 according to the exemplary embodiment. FIG. 4 is a side view of the bonding apparatus 41 according to the exemplary embodiment.

As depicted in FIG. 3 and FIG. 4, the bonding apparatus 41 according to the exemplary embodiment includes a housing 100, a first holder 110, a second holder 120, a moving unit 130, a first gas supply 140, an exhaust unit 150, a first interferometer 160, a second interferometer 170, and a second gas supply 180.

The housing 100 is, for example, a box body having a rectangular shape when viewed from the top, and it accommodates therein the first holder 110, the second holder 120, the moving unit 130, the first gas supply 140, the exhaust unit 150, the first interferometer 160, the second interferometer 170, and the second gas supply 180.

Further, a placing table 101, a plurality of supporting columns 102 standing upright on a top surface of the placing table 101, and a ceiling portion 103 supported by the plurality of supporting columns 102 are disposed within the housing 100.

The first holder 110 attracts and holds a top surface (non-bonding surface W1n) of the first substrate W1 from above. The first holder 110 is supported by the ceiling portion 103 (see FIG. 4). The second holder 120 is provided below the first holder 110, and attracts and holds a bottom surface (non-bonding surface W2n) of the second substrate W2 from below.

Figure 5:
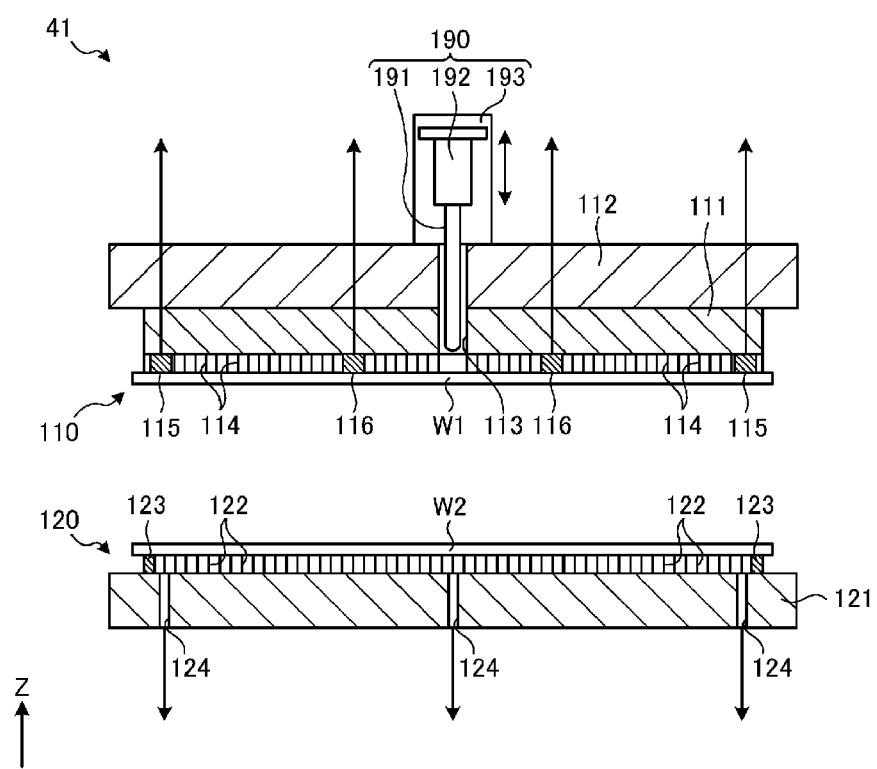
FIG. 5 is a side view of a first holder and a second holder according to the exemplary embodiment.

Here, a configuration example of the first holder 110 and the second holder 120 will be described with reference to FIG. 5. FIG. 5 is a side view of the first holder 110 and the second holder 120 according to the exemplary embodiment.

As depicted in FIG. 5, the first holder 110 has a main body 111. The main body 111 is supported by a supporting member 112. A through hole 113 is formed through the supporting member 112 and the main body 111 in a vertical direction. The position of the through hole 113 corresponds to a central portion of the first substrate W1 attracted to and held by the first holder 110. A push pin 191 of a striker 190 to be described later is inserted through this through hole 113.

The striker 190 is disposed on a top surface of the supporting member 112 and is equipped with the push pin 191, an actuator unit 192, and a linearly moving mechanism 193. The push pin 191 is a columnar member extending along the vertical direction, and is supported by the actuator unit 192.

The actuator unit 192 generates a regular pressure in a certain direction (here, a vertically downward direction) by air supplied from, for example, an electro-pneumatic regulator (not shown). By the air supplied from the electro-pneumatic regulator, the actuator unit 192 is capable of controlling a press load applied to the central portion of the first substrate W1 when it is brought into contact with the central portion of the first substrate W1. Further, a leading end of the push pin 191 is movable up and down in the vertical direction through the through hole 113 by the air from the electro-pneumatic regulator.

The actuator unit 192 is supported by the linearly moving mechanism 193. The linearly moving mechanism 193 moves the actuator unit 192 along the vertical direction by a driving unit having therein a motor, for example.

The striker 190 controls a movement of the actuator unit 192 by the linearly moving mechanism 193, and controls the press load on the first substrate W1 from the push pin 191 by the actuator unit 192. With this configuration, the striker 190 presses the central portion of the first substrate W1 attracted to and held by the first holder 110 into contact with the second substrate W2.

A plurality of pins 114 is provided on a bottom surface of the main body 111, and these pins 114 come into contact with the top surface (non-bonding surface) of the first substrate W1. Each pin 114 has a diameter of, e.g., 0.1 mm to 1 mm and a height of, e.g., several tens of micrometers ($\mu$m) to several hundreds of micrometers ($\mu$m). The plurality of pins 114 are uniformly arranged at a distance of, e.g., 2 mm therebetween.

The first holder 110 is equipped with a plurality of attraction portions for attracting the first substrate W1 in a part of the regions where the plurality of pins 114 are provided. Specifically, a plurality of outer attraction portions 115 and a plurality of inner attraction portions 116 for attracting the first substrate W1 by evacuation are provided in a bottom surface of the main body 111 of the first holder 110. Each of the plurality of outer attraction portions 115 and the plurality of inner attraction portions 116 has an arc-shaped attraction region when viewed from the top. The outer attraction portions 115 and the inner attraction portions 116 have the same height as the pins 114.

The plurality of outer attraction portions 115 are provided at a peripheral portion of the main body 111. The plurality of outer attraction portions 115 are connected to a non-illustrated suction device such as a vacuum pump to attract and hold a peripheral portion of the first substrate W1 by evacuation.

The inner attraction portions 116 are arranged along a circumferential direction of the main body 111 at an inner side than the plurality outer attraction portions 115 in a diametrical direction of the main body 111. The plurality of inner attraction portions 116 are connected to a non-illustrated suction device such as a vacuum pump to attract a region between the peripheral portion and the central portion of the first substrate W1 by evacuation.

The second holder 120 will be explained. The second holder 120 has a main body 121 having a diameter equal to or larger than the diameter of the second substrate W2. Here, the second holder 120 having a diameter larger than that of the second substrate W2 is shown. A top surface of the main body 121 is a facing surface facing the bottom surface (non-bonding surface W2n) of the second substrate W2.

A plurality of pins 122 is provided on the top surface of the main body 121, and these pins 122 come into contact with the bottom surface (non-bonding surface W2n) of the second substrate W2. Each pin 122 has a diameter of, e.g., 0.1 mm to 1 mm and a height of, e.g., several tens of micrometers (μm) to several hundreds of micrometers (μm). These pins 122 are uniformly arranged at a distance of, e.g., 2 mm therebetween.

Moreover, a lower rib 123 is provided in an annular shape on the top surface of the main body 121 to be located outside the plurality of pins 122. The lower rib 123 is formed in the annular shape and supports the peripheral portion of the second substrate W2 over the entire circumference thereof.

Further, the main body 121 has a plurality of lower suction openings 124. The plurality of lower suction openings 124 are provided in an attraction region surrounded by the lower rib 123. These lower suction openings 124 are connected to a non-illustrated suction device such as a vacuum pump via a non-illustrated suction line.

The second holder 120 decompresses the attraction region surrounded by the lower rib 123 by evacuating the attraction region through the plurality of lower suction openings 124. Accordingly, the second substrate W2 disposed in the attraction region is attracted to and held by the second holder 120.

Since the lower rib 123 supports the peripheral portion of the bottom surface of the second substrate W2 over the entire circumference thereof, the second substrate W2 is properly suctioned up to the peripheral portion thereof. Accordingly, the entire surface of the second substrate W2 can be attracted and held. Further, since the bottom surface of the second substrate W2 is supported by the plurality of pins 122, the second substrate W2 may be easily separated from the second holder 120 when the suctioning of the second substrate W2 is released.

This bonding apparatus 41 attracts and holds the first substrate W1 with the first holder 110, and attracts and holds the second substrate W2 with the second holder 120. Then, the bonding apparatus 41 releases the attracting and holding of the first substrate W1 by the inner attraction portions 116, and lowers the push pin 191 of the striker 190 to press the central portion of the first substrate W1. As a result, the combined substrate T in which the first substrate W1 and the second substrate W2 are bonded to each other is obtained. The combined substrate T is carried out from the bonding apparatus 41 by the transfer device 61.

Referring back to FIG. 3 and FIG. 4, a configuration of the moving unit 130 will be described. The moving unit 130 moves the second holder 120 in the horizontal direction. Specifically, the moving unit 130 includes a first moving unit 131 configured to move the second holder 120 along the Y-axis direction, and a second moving unit 132 configured to move the second holder 120 along the X-axis direction.

The first moving unit 131 is mounted to a pair of first rails 131a extending in the Y-axis direction, and is configured to be movable along the pair of first rails 131a. The pair of first rails 131a are provided on the top surface of the placing table 101.

The second moving unit 132 is mounted to a pair of second rails 132a extending in the X-axis direction, and is configured to be movable along the pair of second rails 132a. The pair of second rails 132a are provided on a top surface of the first moving unit 131.

The second holder 120 is mounted to the second moving unit 132, and is moved as one body with the second moving unit 132. Moreover, as stated above, the second moving unit 132 is mounted to the first moving unit 131 with the pair of second rails 132a therebetween. With this configuration, the moving unit 130 is capable of moving the second holder 120 along the Y-axis direction by moving the first moving unit 131, and capable of moving the second holder 120 in the X-axis direction by moving the second moving unit 132.

Moreover, the second moving unit 132 is configured to move the second holder 120 in the vertical direction and, also, rotate it around a vertical axis.

In this way, by moving the second holder 120 in the X-axis, the Y-axis and the θ directions, the moving unit 130 performs position alignment between the first substrate W1 held by the first holder 110 and the second substrate W2 held by the second holder 120 in the horizontal direction. Further, by moving the second holder 120 in the Z-axis direction, the moving unit 130 performs position alignment between the first substrate W1 held by the first holder 110 and the second substrate W2 held by the second holder 120 in the vertical direction.

Further, the moving unit 130 only needs to be able to move the first holder 110 and the second holder 120 relative to each other in the X-axis, the Y-axis and the θ directions. By way of example, the moving unit 130 may move the first holder 110 in the X-axis direction, the Y-axis direction, and the θ direction. Alternatively, the moving unit 130 may move the second holder 120 in the X-axis direction and the Y-axis direction while moving the first holder 110 in the θ direction.

The first gas supply 140 is a fan filter unit (FFU), and it supplies a cleaned first gas into the housing 100. The first gas is, for example, dry air or an inert gas such as a nitrogen gas or an argon gas.

The first gas supply 140 is connected to a first gas source 143 via a first temperature measurement device 149, a first temperature regulator 141, and a valve 142. The first gas supply 140 discharges the first gas adjusted to a preset temperature (a room temperature (e.g., 23° C.) in the present exemplary embodiment) by the first temperature regulator 141 into the housing 100. The first temperature measurement device 149 measures the temperature of the first gas adjusted by the first temperature regulator 141, and outputs the measurement result to a controller of the control device 70.

In the exemplary embodiment, the first gas supply 140 is provided on a side surface 100a orthogonal to the Y-axis direction among a plurality of side surfaces of the housing 100. Then, the first gas supply 140 discharges the first gas along the Y-axis direction (specifically, the positive Y-axis direction).

The exhaust unit 150 is provided on, among the plurality of side surfaces of the housing 100, a side surface 100b opposite to the side surface 100a to which the first gas supply 140 is mounted. The exhaust unit 150 is connected to a non-illustrated suction device such as a vacuum pump, and evacuates the housing 100 by using a suction force of the suction device.

As described above, in the bonding apparatus 41 according to the exemplary embodiment, a side flow is formed within the housing 100 by the first gas supply 140 provided on one side surface 100a of the housing 100 and the exhaust unit 150 provided on another side surface 100b opposite to the side surface 100a.

The first interferometer 160 and the second interferometer 170 are, for example, laser interferometers, and measure a horizontal distance to the second moving unit 132 by radiating laser light to a side surface of the second moving unit 132.

The first interferometer 160 is disposed between the second moving unit 132 and the first gas supply 140 to radiate the laser light along a discharge direction of the first gas by the first gas supply 140, that is, along the Y-axis direction which is a flow direction of the side flow. With this configuration, the first interferometer 160 measures a horizontal distance from a reference point within the first interferometer 160 to the second moving unit 132 along the Y-axis direction.

The second interferometer 170 is disposed between the second moving unit 132 and the side surface 100c orthogonal to the X-axis direction among the plurality of side surfaces of the housing 100. The second interferometer 170 radiates laser light along the X-axis direction that is orthogonal to the flow direction of the side flow. With this configuration, the second interferometer 170 measures a horizontal distance from a reference point within the second interferometer 170 to the second moving unit 132 along the X-axis direction.

In addition, the first interferometer 160 and the second interferometer 170 do not necessarily need to radiate the laser light to the second moving unit 132, and just needs to radiate the laser light to the second moving unit 132 or an object that is moved along with the second moving unit 132. For example, the first interferometer 160 and the second interferometer 170 may measure a horizontal distance to the second holder 120 by radiating the laser light to the second holder 120. In addition, the first interferometer 160 and the second interferometer 170 may radiate the laser light to the second moving unit 132 or another member provided in the second moving unit 132 to measure a horizontal distance to such another member.

Furthermore, the light radiated from the first interferometer 160 and the second interferometer 170 does not necessarily need to be laser light, but it may be light having directivity with a regular cycle.

However, in measuring a length by the interferometer, there is a likelihood that an error may occur due to a change in the temperature or an atmospheric pressure of an environment where the measurement is made. That is, if the temperature or the atmospheric pressure of the environment where the measurement is made is changed, there is a concern that the accurate measurement may not be performed because the wavelength of the light used as a reference changes as the refractive index of air changes.

The inventor of the present application has measured an error in the length measurement in the bonding apparatus 41. As a result, while a measurement error in a direction parallel to the side flow is found to be small, a measurement error in a direction orthogonal to the side flow is found to be big.

In the side flow, a relatively warm current or a relatively cold current partially exists due to heat generation from an electronic system or due to heat transfer from a partition wall with respect to the outside. Further, the side flow itself is also constantly changing and fluctuating. In the side flow having such fluctuations with the temperature variation between the warm current and the cold current as described above, the refractive index of the air always changes. For this reason, a measurement result obtained when the measurement is performed so as to cross the side flow always has an error that varies.

Therefore, in the bonding apparatus 41 according to the exemplary embodiment, the light of the second interferometer 170 radiated so as to cross the side flow is protected by a spot current having a stable temperature in order to reduce the measurement error due to the side flow.

The second gas supply 180 supplies a second gas into a space between the second interferometer 170 and the second moving unit 132 to which the laser light from the second interferometer 170 is radiated. Specifically, the second gas supply 180 discharges the second gas in parallel with an optical path LP of the light radiated from the second interferometer 170 so as to cover the optical path LP. The second gas is, by way of non-limiting example, dry air or an inert gas such as a nitrogen gas or an argon gas.

The second gas supply 180 is connected to a second gas source 183 via a second temperature measurement device 189, a second temperature regulator 181, and a valve 182. The second gas supply 180 discharges the second gas adjusted to a preset temperature (a room temperature (e.g., 23° C.) in the present exemplary embodiment) by the second temperature regulator 181 into the housing 100. The second temperature measurement device 189 measures the temperature of the second gas adjusted by the second temperature regulator 181, and outputs the measurement result to the controller of the control device 70.

The first gas and the second gas are adjusted to the same temperature by the first temperature regulator 141 and the second temperature regulator 181. To elaborate, the controller of the control device 70 controls the second temperature regulator 181 based on the measurement result of the first temperature measurement device 149 so that the temperature of the second gas becomes equal to the temperature of the first gas. Further, the controller of the control device 70 may control the first temperature regulator 141 based on the measurement result of the second temperature measurement device 189 so that the temperature of the first gas becomes equal to the temperature of the second gas.

In addition, although the exemplary embodiment has been described for the case where the bonding apparatus 41 is equipped with the first temperature measurement device 149 and the second temperature measurement device 189, the bonding apparatus 41 just needs to be equipped with at least one of the first temperature measurement device 149 and the second temperature measurement device 189. In addition, although the exemplary embodiment has been described for the case where the bonding apparatus 41 is equipped with the first temperature regulator 141 and the second temperature regulator 181, the bonding apparatus 41 just needs to be equipped with at least one of the first temperature regulator 141 and the second temperature regulator 181. By way of example, when the first temperature measurement device 149 is provided in the first gas supply 140, the bonding apparatus 41 needs to have the second temperature regulator 181 in the second gas supply 180. Further, when the second temperature measurement device 189 is provided in the second gas supply 180, the bonding apparatus 41 needs to have the first temperature regulator 141 in the first gas supply 140.

Figure 6:
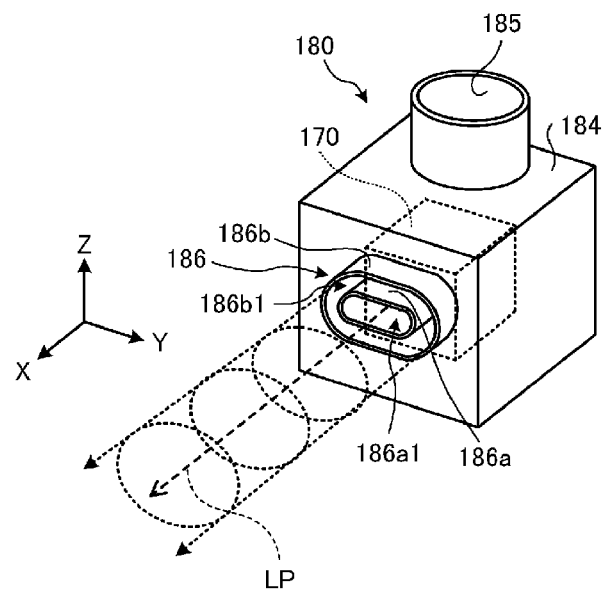
FIG. 6 is a perspective view of a second gas supply according to the exemplary embodiment.
Figure 7:
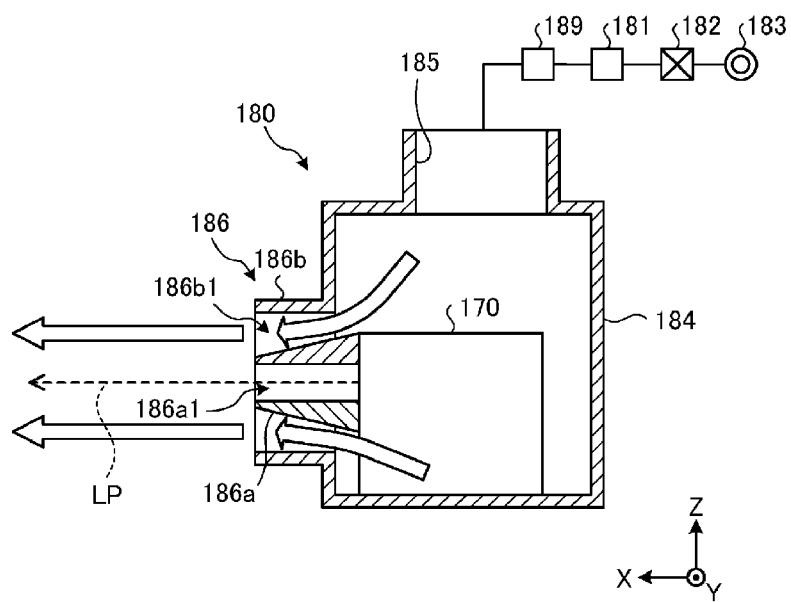
FIG. 7 is a side cross sectional view of the second gas supply according to the exemplary embodiment.

Here, a configuration example of the second gas supply 180 will be described with reference to FIG. 6 and FIG. 7. FIG. 6 is a perspective view of the second gas supply 180 according to the exemplary embodiment. FIG. 7 is a side cross sectional view of the second gas supply 180 according to the exemplary embodiment.

As depicted in FIG. 6 and FIG. 7, the second gas supply 180 includes an accommodation member 184, an inlet member 185, and a nozzle 186.

The accommodation member 184 accommodates the second interferometer 170 therein. The inlet member 185 is a cylindrical portion through which the inside and the outside of the accommodation member 184 communicate with each other. This inlet member 185 is provided on a top surface of the accommodation member 184, for example. The inlet member 185 is connected to the second gas source 183 via the second temperature regulator 181 and the valve 182, and serves to introduce the second gas into the accommodation member 184. The nozzle 186 is provided on a side surface of the accommodation member 184 opposite to the second moving unit 132 (see FIG. 3), and serves to discharge the second gas introduced into the accommodation member 184 from the inlet member 185.

The nozzle 186 according to the exemplary embodiment includes a first opening 186a1 and a second opening 186b1. Specifically, the nozzle 186 is equipped with a first member 186a and a second member 186b each having a cylindrical shape and opened along the X-axis direction. The first member 186a is disposed to be embedded in the second member 186b. The first opening 186a1 corresponds to an opening of the first member 186a. The second opening 186b1 corresponds to a clearance gap formed between the first member 186a and the second member 186b.

A proximal end of the first member 186a is in contact with the second interferometer 170 so as to surround a light radiating portion of the second interferometer 170. Accordingly, the light emitted from the second interferometer 170 passes through the first opening 186a1 and is radiated to the second moving unit 132.

Meanwhile, the second gas supply 180 discharges the second gas from the second opening 186b1. The second gas discharged from the second opening 186b1 flows in parallel with the light emitted from the second interferometer 170 so as to cover the light emitted from the second interferometer 170.

The temperature of the second gas is adjusted by the second temperature regulator 181 and is stabilized. By covering the light radiated from the second interferometer 170 with this second gas, it is possible to protect the light from the ambient thermal environment.

In this way, in the bonding apparatus 41 according to the exemplary embodiment, the second interferometer 170, which is configured to radiate the light in the direction orthogonal to the side flow, is accommodated in the second gas supply 180. In addition, in the bonding apparatus 41 according to the exemplary embodiment, the light radiated from the second interferometer 170 is protected by the current of the second gas discharged from the second gas supply 180.

Accordingly, the light radiated from the second interferometer 170 can be protected from the side flow which has fluctuations with the temperature variations. Moreover, it is also possible to protect the light from thermal influences other than the side flow. Therefore, an error in the measurement result of the second interferometer 170 due to such thermal influences can be suppressed.

As the error of the measurement result of the second interferometer 170 decreases, the positioning precision of the second substrate W2 is improved. Therefore, according to the bonding apparatus 41 of the exemplary embodiment, the bonding precision of the first substrate W1 and the second substrate W2 can be improved.

Also, a method of physically covering the optical path of the light radiated from the second interferometer 170 with a cylindrical cover body may be considered, for example. In this method, however, since the cover body needs to be moved to keep up with the movement of the second holder 120, there is a concern that the structure gets complicated. In addition, a movable range of the second holder 120 is likely to be limited.

Meanwhile, in the bonding apparatus 41 according to the exemplary embodiment, the light radiated from the second interferometer 170 is protected by the current. For this reason, as compared to the case of protecting the light with the physical cover body, the movable range of the second holder 120 may not be limited, and the structure is also simple. Moreover, by using the temperature-controlled current, temperature stability is high, as compared to the protection by the cover body.

In addition, the second gas supply 180 discharges the second gas at a wind speed higher than that of the first gas discharged from the first gas supply 140. Therefore, the light radiated from the second interferometer 170 can be more securely protected.

In addition, although not illustrated here, the bonding apparatus 41 is further equipped with a transition, a position adjusting mechanism, an inverting mechanism, and so forth. In the transition, the first substrate W1, the second substrate W2 and the combined substrate T are temporarily disposed. The position adjusting mechanism adjusts the directions of the first substrate W1 and the second substrate W2 in the horizontal direction. The inverting mechanism inverts the front and rear surfaces of the first substrate W1.

<Specific Operation of Bonding System>

Figure 8:
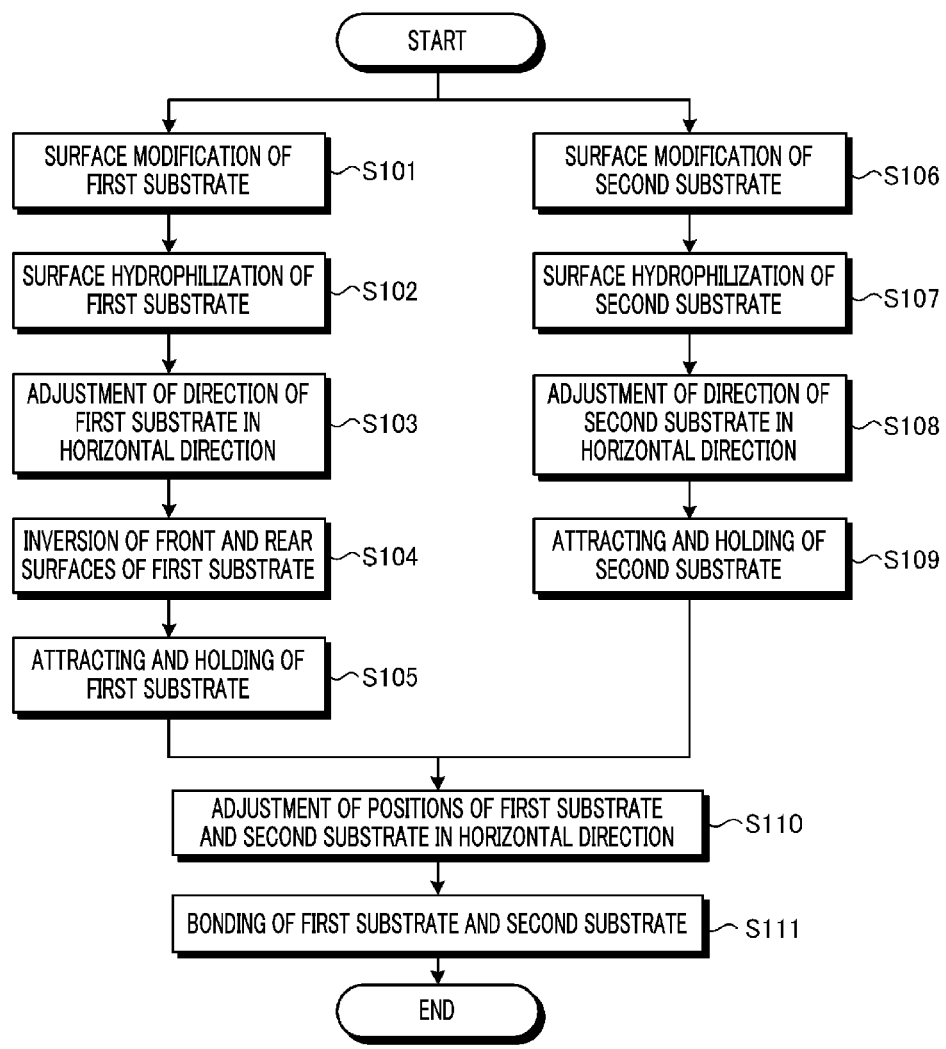
FIG. 8 is a flowchart illustrating a sequence of processings performed by the bonding system according to the exemplary embodiment.

Now, a specific operation of the bonding system 1 according to the exemplary embodiment will be discussed with reference to FIG. 8. FIG. 8 is a flowchart illustrating a sequence of a processing performed by the bonding system 1 according to the exemplary embodiment. The various processes shown in FIG. 8 are performed under the control of the control device 70.

First, the cassette C1 accommodating the plurality of first substrates W1, the cassette C2 accommodating the plurality of second substrates W2, and the empty cassette C3 are placed on the preset placing plates 11 of the carry-in/out station 2. Then, the first substrate W1 is taken out from the cassette C1 by the transfer device 22, and transferred into a transition device disposed within the third processing block G3.

Then, the first substrate W1 is transferred to the surface modifying apparatus 30 of the first processing block G1 by the transfer device 61. In the surface modifying apparatus 30, an oxygen gas as a processing gas is excited into plasma to be ionized under a preset decompressed atmosphere. Oxygen ions are radiated to the bonding surface of the first substrate W1, so that the bonding surface is plasma-processed. As a result, the bonding surface of the first substrate W1 is modified (process S101).

Subsequently, the first substrate W1 is transferred to the surface hydrophilizing apparatus 40 of the first processing block G1 by the transfer device 61. In the surface hydrophilizing apparatus 40, pure water is supplied onto the first substrate W1 while rotating the first substrate W1 held by the spin chuck. As a result, the bonding surface of the first substrate W1 is hydrophilized. Further, the bonding surface of the first substrate W1 is cleaned by this pure water (process S102).

Next, the first substrate W1 is transferred to the bonding apparatus 41 of the second processing block G2 by the transfer device 61. The first substrate W1 carried into the bonding apparatus 41 is then transferred into the position adjusting mechanism via the transition, and the direction of the first substrate W1 in the horizontal direction is adjusted by the position adjusting mechanism (process S103).

Thereafter, the first substrate W1 is delivered to the inverting mechanism from the position adjusting mechanism, and the front surface and the rear surface of the first substrate W1 are inverted by the inverting mechanism (process S104). To elaborate, the bonding surface W1j of the first substrate W1 is turned to face down. Then, the first substrate W1 is delivered to the first holder 110 from the inverting mechanism, and attracted to and held by the first holder 110 (process S105).

In parallel with the processing of the processes S101 to S105 upon the first substrate W1, a processing of the second substrate W2 is performed. First, the second substrate W2 is taken out of the cassette C2 by the transfer device 22, and transferred to the transition device disposed in the third processing block G3.

Then, the second substrate W2 is transferred to the surface modifying apparatus 30 by the transfer device 61, and the bonding surface W2j of the second substrate W2 is modified (process S106). Thereafter, the second substrate W2 is transferred to the surface hydrophilizing apparatus 40 by the transfer device 61, and the bonding surface W2j of the second substrate W2 is hydrophilized and cleaned (process S107).

Subsequently, the second substrate W2 is transferred to the bonding apparatus 41 by the transfer device 61. The second substrate W2 carried into the bonding apparatus 41 is transferred to the position adjusting mechanism via the transition. Then, the direction of the second substrate W2 in the horizontal direction is adjusted by the position adjusting mechanism (process S108).

Afterwards, the second substrate W2 is transferred to the second holder 120 and attracted to and held by the second holder 120 with a notch thereof directed toward a predetermined direction (process S109).

Next, the position adjustment between the first substrate W1 held by the first holder 110 and the second substrate W2 held by the second holder 120 in the horizontal direction is performed (process S110).

Specifically, a center position (X coordinate and Y coordinate) of the second substrate W2 is specified based on the measurement results of the first interferometer 160 and the second interferometer 170. Then, the second substrate W2 is moved by using the first moving unit 131 and the second moving unit 132 so that the center position of the second substrate W2 coincides with a center position of the first substrate W1.

Subsequently, the first substrate W1 and the second substrate W2 are bonded (process S111).

First, the positions of the first substrate W1 held by the first holder 110 and the second substrate W2 held by the second holder 120 in the vertical direction are adjusted. Specifically, the second moving unit 132 moves the second holder 120 vertically upwards, thus allowing the second substrate W2 to be brought closer to the first substrate W1.

Next, after releasing the attracting and holding of the first substrate W1 by the plurality of inner attraction portions 116, the push pin 191 of the striker 190 is lowered to press down the central portion of the first substrate W1.

If the central portion of the first substrate W1 comes into contact with the central portion of the second substrate W2 and the central portions of the first and second substrates W1 and W2 are pressed by the striker 190 with a preset force, bonding is started between the pressed central portions of the first and second substrates W1 and W2. That is, since the bonding surface W1j of the first substrate W1 and the bonding surface W2j of the second substrate W2 are modified, a van der Waals force (intermolecular force) is first generated between the bonding surfaces W1j and W2j, so that the bonding surfaces W1j and W2j are bonded to each other. Furthermore, since the bonding surface W1j of the first substrate W1 and the bonding surface W2j of the second substrate W2 are hydrophilized, hydrophilic groups between the bonding surfaces W1j and W2j are hydrogen-bonded, so that the bonding surfaces W1j and W2j are strongly bonded. In this way, a bonding region is formed.

Thereafter, a bonding wave whereby the bonding region gest expanded from the central portions of the first and second substrates W1 and W2 toward the peripheral portions thereof occurs between the first substrate W1 and the second substrate W2. Afterwards, the attracting and holding of the first substrate W1 by the plurality of outer attraction portions 115 is released. Accordingly, the peripheral portion of the first substrate W1 attracted to and held by the outer attraction portions 115 falls down. As a result, the entire bonding surface W1j of the first substrate W1 and the entire bonding surface W2j of the second substrate W2 are bonded to thereby form the combined substrate T.

Then, the push pin 191 is raised up to the first holder 110, and the attracting and holding of the second substrate W2 by the second holder 120 is released. Thereafter, the combined substrate T is carried out from the bonding apparatus 41 by the transfer device 61. In this way, the bonding processing including the series of processes is completed.

Modification Example of Second Gas Supply

Figure 9:
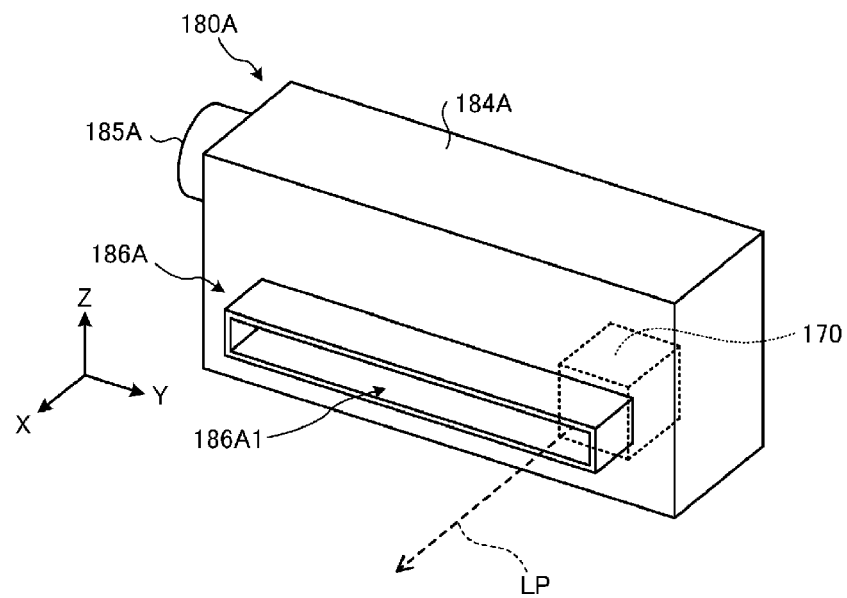
FIG. 9 is a perspective view of a second gas supply according to a modification example.

Now, a modification example of the above-described second gas supply will be described with reference to FIG. 9 and FIG. 10. FIG. 9 is a perspective view of a second gas supply according to a modification example. Further, FIG. 10 is a side cross sectional view of the second gas supply according to the modification example.

Figure 10:
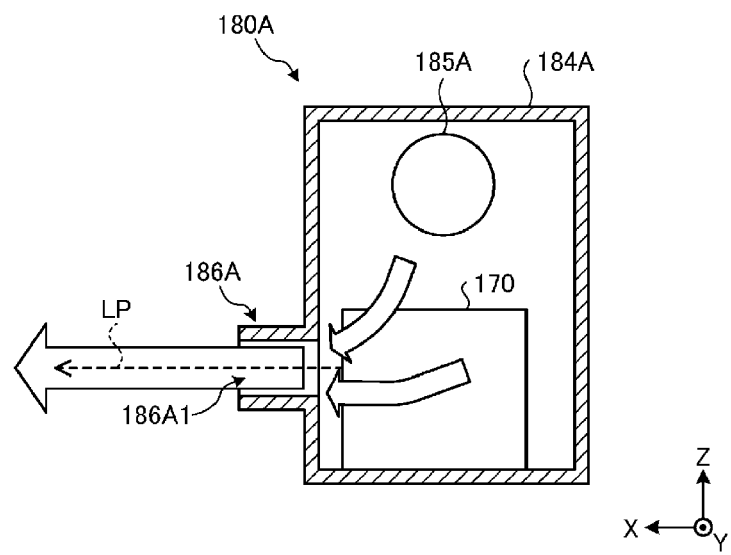
FIG. 10 is a side cross sectional view of the second gas supply according to the modification example.

As illustrated in FIG. 9 and FIG. 10, a second gas supply 180A according to the modification example includes an accommodation member 184A, an inlet member 185A, and a nozzle 186A.

The accommodation member 184A accommodates therein the second interferometer 170. The inlet member 185A is a cylindrical portion through which the inside and the outside of the accommodation member 184A communicate with each other, and is provided on, for example, a side surface of the accommodation member 184A. The inlet member 185A is connected to the second gas source 183 via the second temperature regulator 181 and the valve 182, and serves to introduce the second gas into the accommodation member 184A. The nozzle 186A is provided on a side surface of the accommodation member 184A opposite to the second moving unit 132, and serves to discharge the second gas that is introduced from the inlet member 185A into the accommodation member 184A.

The nozzle 186A has, for example, a single opening 186A1. The nozzle 186A discharges the second gas from this opening 186A1, and also allows the light radiated from the second interferometer 170 to pass through this opening 186A1. The second gas discharged from the opening 186A1 flows in parallel with the light emitted from the second interferometer 170 so as to cover the light emitted from the second interferometer 170. Accordingly, the light radiated from the second interferometer 170 is protected by the second gas.

The opening 186A1 of the nozzle 186A extends in a slit shape along the Y-axis direction which is a discharge direction of the first gas, that is, a flow direction of the side flow. Within the accommodation member 184A, the second interferometer 170 is disposed at a position facing a downstream end of the opening 186A1, and radiates the light through the downstream end of the opening 186A1. Further, the second interferometer 170 needs to be positioned at least on the downstream side of the side flow rather than a center portion in the extension direction of the opening 186A1.

As described above, the slit-shaped opening 186A1 extending along the flow direction of the side flow may be provided in the second gas supply 180A to discharge the second gas from the upstream side of the light radiated from the second interferometer 170. With this configuration, the light radiated from the second interferometer 170 can be more securely protected.

Modification Example of First Gas Supply

Figure 11:
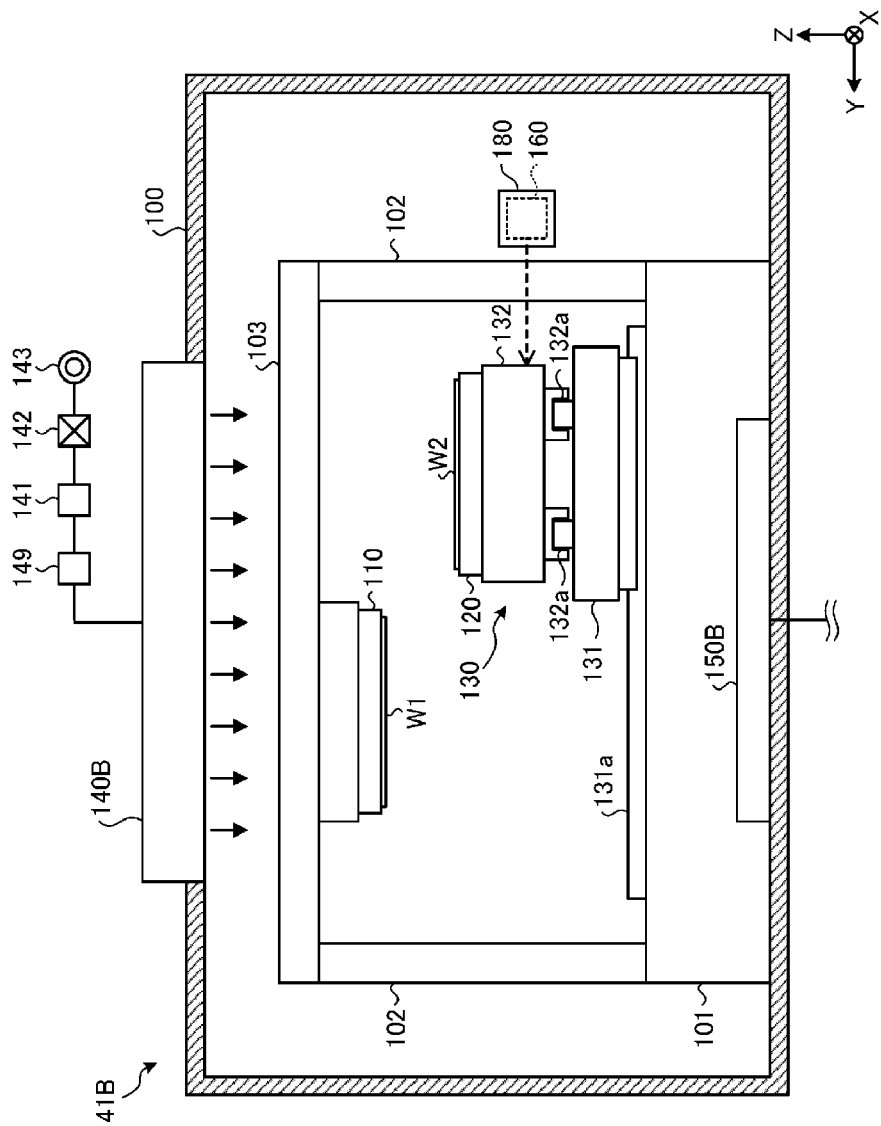
FIG. 11 is a side view of a bonding apparatus according to a modification example.

Now, a modification example of the first gas supply will be described with reference to FIG. 11. FIG. 11 is a side view of a bonding apparatus according to a modification example.

As illustrated in FIG. 11, a bonding apparatus 41B according to the modification example includes a first gas supply 140B and an exhaust unit 150B. The first gas supply 140B is provided on a top surface of the housing 100 and discharges the first gas vertically downwards. Further, the exhaust unit 150B is provided on a bottom surface of the housing 100.

In this way, the bonding apparatus 41B may form a downflow within the housing 100 by using the first gas supply 140B and the exhaust unit 150B. In this case, not only the light radiated from the second interferometer 170 but the light radiated from the first interferometer 160 is also orthogonal to a flow direction (Z-axis direction) of the downflow. For this reason, in the bonding apparatus 41B, the second gas supply 180 is provided in the first interferometer 160 as well to protect the light radiated from the first interferometer 160 by the current of the second gas.

Other Modification Examples

The above exemplary embodiment has been described for the case where the light radiated from the interferometer is orthogonal to the side flow or the downflow. Without being limited thereto, however, the interferometer may radiate the light in a direction intersecting with the discharge direction of the first gas by the first gas supply. In this case, the second gas supply may discharge the second gas in a direction parallel to the light, that is, in a direction intersecting with the side flow or the downflow.

In addition, the above exemplary embodiment has been described for the case where the second gas supply discharges the second gas in parallel with the light radiated from the interferometer. However, the exemplary embodiment is not limited thereto, and the second gas supply may discharge the second gas from a direction intersecting with the light emitted from the interferometer, specifically, from a direction orthogonal to the light. In this case, it is desirable that the second gas supply discharges the second gas to the optical path of the light radiated from the interferometer from a more upstream side of the side flow or the downflow than the optical path. That is, it is desirable that the second gas supply discharges the second gas in the same direction as the side flow or the downflow.

As described above, as a bonding apparatus configured to bond substrates to each other, a bonding apparatus (as an example, the bonding apparatus 41 or 41B) according to the exemplary embodiment includes a first holder (as an example, the first holder 110); a second holder (as an example, the second holder 120), a moving unit (as an example, the moving unit 130), a housing (as an example, the housing 100), an interferometer (as an example, the first interferometer 160 and the second interferometer 170), a first gas supply (as an example, the first gas supply 140 or 140B), and a second gas supply (as an example, the second gas supply 180 or 180A). The first holder attracts and holds a first substrate (as an example, the first substrate W1) from above. The second holder attracts and holds a second substrate (as an example, the second substrate W2) from below. The moving unit moves a first one of the first holder and the second holder in a horizontal direction with respect to a second one of the first holder and the second holder. The housing accommodates therein the first holder, the second holder, and the moving unit. The interferometer is disposed within the housing and radiates light (as an example, laser light) to the first one or an object moved along with the first one to measure a horizontal distance to the first one or the object. The first gas supply supplies a clean first gas to the inside of the housing. The second gas supply supplies a second gas to a space between the interferometer and the first one or the object to which the light is radiated.

Therefore, according to the bonding apparatus of the exemplary embodiment, the bonding precision for the substrates can be improved in a bonding technique of bonding the substrates to each other.

The second gas supply may discharge the second gas in parallel with an optical path of the light so as to cover the optical path. Accordingly, the light radiated from the interferometer can be properly protected.

The interferometer may radiate the light in a direction intersecting with a discharge direction of the first gas by the first gas supply, and the second gas supply may discharge the second gas in a direction intersecting with the discharge direction of the first gas by the first gas supply. The interferometer that radiates the light in the direction intersecting with the discharge direction of the first gas by the first gas supply may be easily affected by the temperature of the first gas. Therefore, by protecting the light radiated in this direction through the use of a current of the second gas, it is possible to properly protect the light radiated from the interferometer.

The first gas supply (as an example, the first gas supply 140) may be provided on a side surface (as an example, the side surface 100a) of the housing, and may discharge the first gas in a first horizontal direction (as an example, the Y-axis direction). In this case, the interferometer (as an example, the second interferometer 170) may radiate the light in a second horizontal direction (as an example, the X-axis direction) orthogonal to the first horizontal direction, and the second gas supply may discharge the second gas in the second horizontal direction The first gas supply (as an example, the first gas supply 140B) may be provided on a top surface of the housing, and may discharge the first gas in a vertical direction (as an example, the Z-axis direction).

The second gas supply may be equipped with an accommodation member (as an example, the accommodation member 184 or 184A) accommodating therein the interferometer; an inlet member (as an example, the inlet member 185 or 185A) configured to introduce the second gas into the accommodation member; and a nozzle (as an example, the nozzle 186 or 186A) provided in the accommodation member and configured to discharge the second gas that is introduced from the inlet member into the accommodation member. In this case, the interferometer may radiate the light from the inside of the accommodation member via the nozzle. With this configuration, the second gas supply is capable of discharging the second gas in parallel with the optical path of the light so as to cover the optical path.

The nozzle (as an example, the nozzle 186) includes a first opening (as an example, the first opening 186a1) through which the light passes, and a second opening (as an example, the second opening 186a2) having an annular shape and surrounding the first opening. In this case, the second gas supply may discharge the second gas through the second opening. Further, the nozzle (as an example, the nozzle 186A) may be provided with an opening (as an example, the opening 186A1) extending along a discharge direction of the first gas. In this case, the interferometer may radiate the light from a downstream side of the opening. In this way, by discharging the second gas from a more upstream side than the light radiated from the interferometer, it is possible to more securely protect the light radiated from the interferometer.

The second gas supply may discharge the second gas at a higher wind speed than that of the first gas discharged from the first gas supply. Accordingly, the light radiated from the interferometer can be properly protected from a current of the first gas.

The first gas supply may be equipped with a first temperature measurement device configured to measure the temperature of the first gas, and the second gas supply may be equipped with a second temperature regulator configured to adjust the temperature of the second gas. In this case, the bonding apparatus according to the exemplary embodiment may be further equipped with a controller configured to adjust the temperature of the second gas to a temperature equal to the temperature of the first gas by controlling the second temperature regulator based on a measurement result of the first temperature measurement device.

The first gas supply may be equipped with a first temperature regulator configured to adjust the temperature of the first gas, and the second gas supply may be equipped with a second temperature measurement device configured to measure the temperature of the second gas. In this case, the bonding apparatus according to the exemplary embodiment may be further equipped with a controller configured to adjust the temperature of the first gas to a temperature equal to the temperature of the second gas by controlling the first temperature regulator based on a measurement result of the second temperature measurement device.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to improve the bonding precision between the substrates in the bonding technique of bonding the substrates to each other.

We claim:

1. A bonding apparatus configured to bond substrates to each other, comprising:
a first holder configured to attract and hold a first substrate from above;
a second holder configured to attract and hold a second substrate from below;
a moving unit configured to move a first one of the first holder and the second holder in a horizontal direction with respect to a second one of the first holder and the second holder;
a housing accommodating therein the first holder, the second holder, and the moving unit;
an interferometer, disposed within the housing, configured to radiate light to the first one or an object moved along with the first one to measure a horizontal distance to the first one or the object;
a first gas supply configured to supply a first gas to an inside of the housing; and
a second gas supply configured to supply a second gas to a space between the interferometer and the first one or the object to which the light is radiated,
wherein the second gas supply discharges the second gas in parallel with an optical path of the light so as to cover the optical path,
wherein the second gas supply comprises:
an accommodation member accommodating the interferometer therein;
an inlet member configured to introduce the second gas into the accommodation member; and
a nozzle, provided at the accommodation member, configured to discharge the second gas that is introduced into the accommodation member from the inlet member, and
wherein the interferometer radiates the light from an inside of the accommodation member via the nozzle.

2. The bonding apparatus of claim 1,
wherein the interferometer radiates the light in a direction intersecting with a discharge direction of the first gas by the first gas supply, and
the second gas supply discharges the second gas in the direction intersecting with the discharge direction of the first gas by the first gas supply.

3. The bonding apparatus of claim 2,
wherein the first gas supply is provided on a side surface of the housing, and discharges the first gas in a first horizontal direction,
the interferometer radiates the light in a second horizontal direction orthogonal to the first horizontal direction, and
the second gas supply discharges the second gas in the second horizontal direction.

4. The bonding apparatus of claim 2,
wherein the first gas supply is provided on a top surface of the housing, and discharges the first gas in a vertical direction.

5. The bonding apparatus of claim 1,
wherein the nozzle comprises:
a first opening through which the light passes; and
a second opening having an annular shape and surrounding the first opening, and
wherein the second gas supply discharges the second gas through the second opening.

6. The bonding apparatus of claim 5,
wherein the nozzle has an opening extending in a discharge direction of the first gas.

7. The bonding apparatus of claim 6,
wherein the interferometer radiates the light from a downstream side of the opening.

8. The bonding apparatus of claim 1,
wherein the second gas supply discharges the second gas at a wind speed higher than that of the first gas discharged from the first gas supply.

9. The bonding apparatus of claim 1,
wherein the first gas supply comprises a first temperature measurement device configured to measure a temperature of the first gas,
the second gas supply comprises a second temperature regulator configured to adjust a temperature of the second gas, and
the bonding apparatus further comprises a controller configured to adjust the temperature of the second gas to a temperature equal to the temperature of the first gas by controlling the second temperature regulator based on a measurement result of the first temperature measurement device.

10. The bonding apparatus of claim 1,
wherein the first gas supply comprises a first temperature regulator configured to adjust a temperature of the first gas,
the second gas supply comprises a second temperature measurement device configured to measure a temperature of the second gas, and
the bonding apparatus further comprises a controller configured to adjust the temperature of the first gas to a temperature equal to the temperature of the second gas by controlling the first temperature regulator based on a measurement result of the second temperature measurement device.

11. A bonding system, comprising:
a surface modifying apparatus configured to modify a surface of a first substrate and a surface of a second substrate;
a surface hydrophilizing apparatus configured to hydrophilize the modified surface of the first substrate and the modified surface of the second substrate; and
a bonding apparatus configured to bond the hydrophilized first substrate and the hydrophilized second substrate by an intermolecular force,
wherein the bonding apparatus comprises:
a first holder configured to attract and hold the first substrate from above;
a second holder configured to attract and hold the second substrate from below;
a moving unit configured to move a first one of the first holder and the second holder in a horizontal direction with respect to a second one of the first holder and the second holder;
a housing accommodating therein the first holder, the second holder, and the moving unit;
an interferometer, disposed within the housing, configured to radiate light to the first one or an object moved along with the first one to measure a horizontal distance to the first one or the object;
a first gas supply configured to supply a first gas to an inside of the housing; and
a second gas supply configured to supply a second gas to a space between the interferometer and the first one or the object to which the light is radiated,
wherein the second gas supply discharges the second gas in parallel with an optical path of the light so as to cover the optical path,
wherein the second gas supply comprises:
an accommodation member accommodating the interferometer therein;
an inlet member configured to introduce the second gas into the accommodation member; and
a nozzle, provided at the accommodation member, configured to discharge the second gas that is introduced into the accommodation member from the inlet member, and
wherein the interferometer radiates the light from an inside of the accommodation member via the nozzle.

12. A bonding method of bonding substrates to each other, comprising:
attracting and holding a first substrate with a first holder configured to attract and hold the first substrate from above;
attracting and holding a second substrate with a second holder configured to attract and hold the second substrate from below; and
positioning the first holder and the second holder in a horizontal direction with a moving unit configured to move a first one of the first holder and the second holder in the horizontal direction with respect to a second one of the first holder and the second holder,
wherein, in a housing accommodating therein the first holder, the second holder and the moving unit, an interferometer, a first gas supply and a second gas supply are disposed, the interferometer being configured to radiate light to the first one or an object moved along with the first one to measure a horizontal distance to the first one or the object, the first gas supply being configured to supply a clean first gas to an inside of the housing, the second gas supply being configured to supply a second gas to a space between the interferometer and the first one or the object to which the light is radiated, and
in the positioning of the first holder and the second holder, the moving unit is moved based on a measurement result of the interferometer,
wherein the second gas supply discharges the second gas in parallel with an optical path of the light so as to cover the optical path,
wherein the second gas supply comprises:
an accommodation member accommodating the interferometer therein;
an inlet member configured to introduce the second gas into the accommodation member; and
a nozzle, provided at the accommodation member, configured to discharge the second gas that is introduced into the accommodation member from the inlet member, and
wherein the interferometer radiates the light from an inside of the accommodation member via the nozzle.

* * * * *